United States Patent
Jia et al.

(10) Patent No.: US 10,400,104 B2
(45) Date of Patent: Sep. 3, 2019

(54) CURABLE SILICONE RUBBER COMPOSITION FOR LED PACKAGING

(71) Applicant: ELKEM SILICONES SHANGHAI CO., LTD., Shanghai (CN)

(72) Inventors: Liya Jia, Shanghai (CN); Shifang Zhao, Shanghai (CN); Yili Yang, Shanghai (CN)

(73) Assignee: ELKEM SILICONES SHANGHAI CO., LTD, Shanghai (CN)

( * ) Notice: Subject to any disclaimer, the term of this patent is extended or adjusted under 35 U.S.C. 154(b) by 67 days.

(21) Appl. No.: 15/107,791

(22) PCT Filed: Nov. 20, 2014

(86) PCT No.: PCT/CN2014/091734
§ 371 (c)(1),
(2) Date: Jun. 23, 2016

(87) PCT Pub. No.: WO2015/096570
PCT Pub. Date: Jul. 2, 2015

(65) Prior Publication Data
US 2016/0333182 A1    Nov. 17, 2016

(30) Foreign Application Priority Data

Dec. 27, 2013  (CN) .......................... 2013 1 0737774

(51) Int. Cl.
*C08L 83/04* (2006.01)
*H01L 33/56* (2010.01)
*C08K 5/3492* (2006.01)
*C08K 5/56* (2006.01)
*C08L 83/00* (2006.01)

(52) U.S. Cl.
CPC .......... *C08L 83/04* (2013.01); *C08K 5/34924* (2013.01); *C08K 5/56* (2013.01); *C08L 83/00* (2013.01); *H01L 33/56* (2013.01)

(58) Field of Classification Search
CPC ..... C08G 77/12; C08G 77/20; C08K 5/34924
See application file for complete search history.

(56) References Cited

U.S. PATENT DOCUMENTS

| | | | |
|---|---|---|---|
| 3,159,601 A | 12/1964 | Ashby | |
| 3,159,602 A | 12/1964 | Hamilton et al. | |
| 3,220,972 A | 11/1965 | Lamoreaux | |
| 3,377,432 A | 4/1968 | Abott et al. | |
| 3,419,593 A | 12/1968 | Willing | |
| 3,715,334 A | 2/1973 | Karstedt | |
| 3,814,730 A | 6/1974 | Karstedt | |
| 3,882,083 A * | 5/1975 | Berger | C08K 5/3477 528/15 |
| 2011/0147955 A1 | 6/2011 | Kashiwagi | |
| 2013/0165611 A1* | 6/2013 | Manabe | C07F 7/21 526/279 |

FOREIGN PATENT DOCUMENTS

| | | | |
|---|---|---|---|
| CN | 101671483 A | 3/2010 | |
| CN | 101921488 A | 12/2010 | |
| CN | 101935455 A | 1/2011 | |
| EP | 0057459 A1 | 8/1982 | |
| EP | 0188978 A1 | 7/1986 | |
| EP | 0190530 A1 | 8/1986 | |
| EP | 2497802 A1 | 9/2012 | |
| WO | 2011/117230 A2 | 9/2011 | |
| WO | WO-2011107592 A1 * | 9/2011 | ............ C08L 83/04 |

OTHER PUBLICATIONS

International Search Report dated Mar. 4, 2015, and English Translation of the International Search Report corresponding to International Patent Application No. PCT/CN2014/091734, 4 pages.

\* cited by examiner

*Primary Examiner* — Kuo Liang Peng
(74) *Attorney, Agent, or Firm* — Dentons US LLP

(57) ABSTRACT

A curable silicone rubber composition is described for an LED enclosure or packaging. A process for preparing the same and the use thereof are also described. Particularly, the compositions can include at least one tackifier component D, which includes:
  a) a alkenyl or hydrosilyl group including an isocyanurate compound E, and
  b) an adhesion-imparting ingredient having at least two functional groups selected from the group consisting of alkenyl, epoxy, alkoxy and hydrosilyl groups, which includes of polysiloxane F and optional coupling agents G.

32 Claims, 1 Drawing Sheet

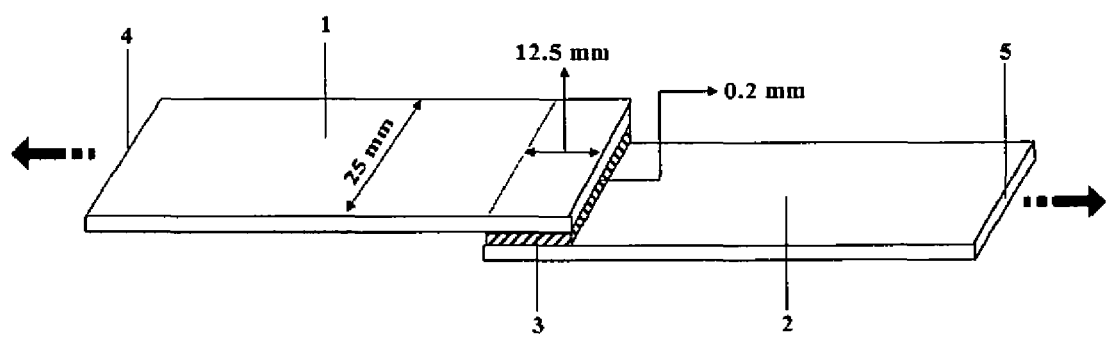

CURABLE SILICONE RUBBER COMPOSITION FOR LED PACKAGING

CROSS-REFERENCE TO PRIOR APPLICATIONS

This application is a National Stage of PCT/CN2014/091734, filed Nov. 20, 2014, and designating the United States (published on Jul. 2, 2015, as WO 2015/096570 A1), which claims priority under 35 U.S.C. § 119 to Chinese Patent Application No. 201310737774.8, filed Dec. 27, 2013, each hereby expressly incorporated by reference in its entirety and each assigned to the assignee hereof.

TECHNICAL FIELD

The present invention relates to a curable silicone rubber composition for LED enclosure, the process for preparing the same and the use thereof.

BACKGROUND

At present, owing to its advantages such as low power consumption, small size, long service life, avoidance of mercury and no environmental pollution etc., the light emitting diode (LED) is widely used in the field of special lighting, such as automobiles, back light, traffic lights, industrial equipment, instrumentation panels. With improvements of the performance of LED, LED is expected to replace traditional light sources such as fluorescent light, incandescent light and becomes the fourth-generation light source.

Early LED enclosure materials are mostly epoxy resin which has the advantages like higher refractive index and good adhesion properties etc., but also obvious drawbacks in terms of weatherability and yellowing resistance. Silicone rubber, however, possesses a series of excellent performances such as excellent weatherability, heat resistance and yellowing resistance, and thus the application of silicone rubber in the LED enclosure has represented the development trend nowadays. For use of silicone rubber material as LED enclosure materials, there are still some outstanding technical problems to be resolved, such as adhesion force with PPA (polyphthalamide resin) and metal, good light transmittance and storage stability of the product, and so on. Normally, the adhesion property may be improved by simply adding various silane coupling agents. But in most cases it is difficult to balance the requirements on adhesion and transmittance, or there occurs turbidity during the storage of the product resulting in various problems such as less transparency and shorter shelf life accordingly.

In order to achieve both good adhesion to various enclosure materials made of thermoplastic material, for example PPA, or to the electrodes made of metals, for example Ag and Au, and also take the excellent transparency into consideration, it is proposed in prior art that the specific organic polysiloxane component having the refractive index difference falling within a very narrow range (such as below 0.03) is used as the matrix of the silicone rubber composition, with generally adding metallic condensation catalyst such as aluminum metal chelate catalyst to facilitate the coupling and adhesion. However, such a technical solution limits the material selection for the silicone rubber composition. Moreover, although it is shown from mechanism and some experimental data that the metallic condensation catalyst such as aluminum metal chelate catalyst can facilitate the adhesion to some extent, the catalyst extremely trends to react with e.g. air under normal operating conditions in practical application, resulting in catalyst deterioration and adverse effect on use. In industrial production, some special control processes are required in order to avoid this problem.

In addition, CN101935455A proposes an organic silicone material for LED enclosure and the method for preparing the same, which improve optical property, mechanical property and adhesion force to the bracket at the same time. Vinyl polysiloxane, hydrogen-containing polysiloxane and vinyl MQ resin are used as main components of the inventive composition, wherein the mixture of various coupling agents and catalysts such as trimethoxysilane, n-butyl titanate are also used. However, if there are no restrictions on selecting coupling agents and only the adhesive force is considered, many selected coupling agents may render the product turbid or slightly white due to slow hydrolysis during storage, thereby affecting the transmittance and storage period of the final product.

SUMMARY OF THE INVENTION

The present invention aims to provide a curable silicone rubber composition which should have improved optical performances (higher transmittance) and the improved adhesion force to thermoplastic materials such as PPA and metals, in combination with better stability during the storage. Furthermore, a wider selection scope for the components of the silicone rubber composition should be obtained and the metallic condensation catalysts can be omitted, as is thereby more beneficial to the formulation of the silicone rubber composition.

It has been found, the aim of the present invention can be achieved very well by using the curable silicone rubber composition as described below.

The first aspect of the present invention relates to the curable silicone rubber composition, comprising (A) at least one organopolysiloxane A having at least two alkenyl group bonded to the Si-atom per molecule, or the combination of the said organopolysiloxane A with at least one organopolysiloxane resin A' having at least one alkenyl group bonded to the Si-atom per molecule, (B) at least one organosiloxane B or organosiloxane resin B' having at least two hydrogen atoms bonded to the same or different Si-atom per molecule, or the mixture of organosiloxane B and organosiloxane resin B' having at least one hydrogen atoms bonded to the same or different Si-atom per molecule, (C) at least one platinum group metal based catalyst C, and (D) at least one tackifier component D, which comprises
 a) a alkenyl or hydrosilyl group containing isocyanurate compound E, and
 b) an adhesion-imparting ingredient which is consisting of:
  a polysiloxane F having at least two functional groups selected from alkenyl, epoxy, alkoxy and hydrosilyl groups, and
  optionally a coupling agents G.

In a preferred embodiment, the components of the curable silicone rubber composition according to the present invention should be adjusted so that the molar ratio of SiH group to alkenyl group is 0.7-4, preferably 0.8-3, and more preferably 1-2.

The second aspect of the present invention relates to a process for preparing said curable silicone rubber composition.

The third aspect of the present invention relates to a use of said composition for LED enclosure materials.

The fourth aspect of the present invention relates to a use of tackifier component as described above for improving adhesion of the curable silicone rubber composition for LED enclosure without using metallic condensation catalysts.

The fifth aspect of the present invention relates to the silicone rubber obtained by curing the curable silicone rubber composition as described above.

Organopolysiloxane A

In the curable silicone rubber composition of the present invention, at least one organopolysiloxane A having at least two alkenyl group bonded to the Si-atom per molecule is used. The alkenyl group can be in any position on the organopolysiloxane backbone, such as the end or the middle of the molecular chain or both the end and the middle of the molecular chain.

Said organopolysiloxane A comprises (i) the siloxy unit of formula (I-1),

$$R_a^x Z_b \text{SiO} \frac{4-(a+b)}{2} \qquad \text{(I-1)}$$

in which $R^x$ denotes $C_{2-12}$ alkenyl, preferably $C_{2-6}$ alkenyl, most preferably vinyl or allyl, Z may identically or differently, denote monovalent hydrocarbyl group having 1 to 30, preferably 1 to 12 carbon atoms, which is preferably selected from $C_{1-8}$ alkyl group, including alkyl optionally substituted by at least one halogen atom, and also preferably selected from aryl group, in particular $C_{6-20}$ aryl group.

a is 1 or 2, b is 0, 1 or 2 and the sum of a and b is 1, 2 or 3, and optionally (ii) the other siloxy unit of formula (I-2)

$$Z_c \text{SiO} \frac{4-c}{2} \qquad \text{(I-2)}$$

in which

Z has the meaning as described above and c is 0, 1, 2, or 3.

In a preferred embodiment, Z can be selected from methyl, ethyl, propyl, 3, 3, 3-trifluoropropyl group, phenyl, xylyl and tolyl and the like. Preferably, methyl accounts for at least 60 mol % (or by numbers) of the group Z.

Said organopolysiloxane A can have viscosity of at least equal to 50 mPa·s, and preferably less than 200,000 mPa·s. In the present application, all viscosities relate to dynamic viscosity values and can be measured for example in a known manner at 20° C. using Brookfield viscometer.

Organopolysiloxane A can be only formed from the unit of formula (I-1) or may comprise the unit of formula (I-2) additionally. Said organopolysiloxane A is linear, branched or cyclic. Without impairing the object of the invention, the molecular chain can also contain the network structure, but preferably the amount of the network structure does not exceed 10%, more preferably not more than 5% in the organopolysiloxane A molecules.

The examples of the siloxy unit of formula (I-1) are vinyl dimethyl siloxy, vinyl phenyl methyl siloxy, vinyl methyl siloxy and vinyl siloxy units.

The examples of the siloxy unit of formula (I-2) are $SiO_{4/2}$ unit, dimethyl siloxy, methyl phenyl siloxy, diphenyl siloxy, methyl siloxy and phenyl siloxy group.

The examples of organopolysiloxane A include linear or cyclic compounds, such as dimethylpolysiloxane (including dimethyl vinyl siloxy end group), (methyl vinyl) (dimethyl) polysiloxane copolymer (including trimethyl siloxy end group), (methyl vinyl) (dimethyl) polysiloxane copolymer (including dimethyl vinyl siloxy end group) and cyclic methyl vinyl polysiloxane.

Organopolysiloxane Resin A'

As an alternative, the component (A) can be the combination of organopolysiloxane A and organopolysiloxane resin A' described above.

Said organopolysiloxane resin A' comprises a) at least two different siloxane units selected from siloxane unit M of formula $R_3SiO_{1/2}$, siloxane unit D of formula $R_2SiO_{2/2}$, siloxane unit T of formula $RSiO_{3/2}$ and siloxane unit Q of formula $SiO_{4/2}$, in which R denotes monovalent hydrocarbon group with 1 to 20 carbon atoms, b) provided that at least one of these siloxane units is siloxane unit T or Q and at least one of siloxane units M, D and T contains alkenyl group.

Thus, according to preferred embodiments, the organopolysiloxane resin A' can be selected from the following groups:

organopolysiloxane resin of formula $MT^{Vi}Q$, which is basically consisted of the following units:
  (a) trivalent siloxane unit $T^{Vi}$ of formula $R'SiO_{3/2}$;
  (b) monovalent siloxane unit M of formula $R_3SiO_{1/2}$; and
  (c) tetravalent siloxane unit Q of formula $SiO_{4/2}$;

organopolysiloxane resin of formula $MD^{Vi}Q$, which is basically consisted of the following units:
  (a) divalent siloxane unit $D^{Vi}$ of formula $R'SiO_{2/2}$;
  (b) monovalent siloxane unit M of formula $R_3SiO_{1/2}$; and
  (c) tetravalent siloxane unit Q of formula $SiO_{4/2}$;

organopolysiloxane resin of formula $MDD^{Vi}Q$, which is basically consisted of the following units:
  (a) divalent siloxane unit $D^{Vi}$ of formula $RR'SiO_{2/2}$;
  (b) divalent siloxane unit D of formula $R_2SiO_{1/2}$;
  (c) monovalent siloxane unit M of formula $R_3SiO_{1/2}$; and
  (d) tetravalent siloxane unit Q of formula $SiO_{4/2}$;

organopolysiloxane resin of formula $M^{Vi}Q$, which is basically consisted of the following units:
  (a) monovalent siloxane unit $M^{Vi}$ of formula $R'R_2SiO_{1/2}$;
  (b) tetravalent siloxane unit Q of formula $SiO_{4/2}$; and organopolysiloxane resin of formula $M^{Vi}T^{Vi}$, which is basically consisted of the following units:
  (a) monovalent siloxane unit $M^{Vi}$ of formula $R'R_2SiO_{1/2}$;
  (b) trivalent siloxane unit $T^{Vi}$ of formula $R'SiO_{3/2}$; and
  (c) tetravalent siloxane unit Q of formula $SiO_{4/2}$;

in which

R represents monovalent hydrocarbyl having 1 to 20 carbon atoms, preferably represents monovalent aliphatic or aromatic hydrocarbon having 1 to 12, more preferably 1 to 8 carbon atoms, and R' represents alkenyl, preferably alkenyl with 2 to 12, more preferably 2 to 6 carbon atoms, in particular preferably vinyl or allyl, most preferably vinyl.

In further preferable embodiment, said organopolysiloxane resin A' may be the organopolysiloxane resin of formula $MD^{Vi}Q$, which is basically consisted of the following units:

(a) divalent siloxane unit D vi of formula $RR'SiO_{2/2}$;
(b) monovalent siloxane unit M of formula $R_3SiO_{1/2}$; and
(c) tetravalent siloxane unit Q of formula $SiO_{4/2}$;
wherein R and R' are as defined above.

Advantageously, said organopolysiloxane resin A' has a weight-average molecular weight in range of 200-50,000, preferably 500-30,000. Herein, said weight-average molecular weight could be measured by gel permeation chromatography and calculated using polystyrene as standard.

In the curable silicone rubber composition according to the present invention, if the combination of at least one organopolysiloxane A and at least one organopolysiloxane resin A' is used as the component A), the organopolysiloxane resin A' accounts for 0~0.9, preferably 0.2~0.6 in the component A), based on the total weight of the organopolysiloxane A and the organopolysiloxane A' of 1.

Organopolysiloxane B

In the curable silicone rubber composition of the present invention, at least one organopolysiloxane B having at least two hydrogen atoms bonded to the same or different Si-atom per molecule may be used, or the organopolysiloxane B having at least one hydrogen atom bonded to the same or different Si-atom per molecule may be used in case of using the mixture.

The organopolysiloxane having SiH group enables cross-linking reaction with other components, i.e. the cured products can be formed by reacting SiH group in the component with alkenyl in other components. As for said organopolysiloxane B having at least one hydrogen atom bonded to the same or different Si-atom per molecule, it is preferable that each of molecules has two, three or more SiH group.

In a preferred embodiment, said organopolysiloxane B comprises
(i) siloxy unit of formula (II-1), $$H_d L_e SiO\frac{4-(d+e)}{2} \quad (\text{II-1})$$

in which

L may identically or differently, denote monovalent hydrocarbyl group, which is preferably selected from $C_{1-8}$ alkyl group, including alkyl optionally substituted by at least one halogen atom, and also preferably selected from aryl group, in particular $C_{6-20}$ aryl group.

d is 1 or 2, e is 0, 1 or 2 and the sum of d and e is 1, 2 or 3, and optionally (ii) at least one other unit of average formula (II-2)

$$L_g SiO\frac{4-g}{2} \quad (\text{II-2})$$

in which

L has the meaning as described above and g is 0, 1, 2, or 3.

In a more preferred embodiment, L can be selected from methyl, ethyl, propyl, 3, 3, 3-trifluoropropyl group, phenyl, xylyl and tolyl and the like.

Said organopolysiloxane B has a dynamic viscosity of at least equal to 10 mPa·s, and preferably within 20-1,000 mPa·s.

The organopolysiloxane B can be only formed of the unit of formula (II-1) or may additionally comprise the unit of formula (II-2). Said organopolysiloxane B can be linear, branched or cyclic. Without impairing the object of the invention, the molecular chain can also contain the network structure, but the amount of the network structure does not preferably exceed 10%, more preferably not more than 5% in the organopolysiloxane molecules. L group has the same meaning as given above for group Z.

The examples of the unit of formula (II-1) are $H(CH_3)_2SiO_{1/2}$, $HCH_3SiO_{2/2}$ and $H(C_6H_5)SiO_{2/2}$.

The examples of the unit of formula (II-2) may be the same as the examples of the unit of formula (I-2) given above.

The example of organopolysiloxane B includes linear or cyclic compounds, such as dimethylpolysiloxane (including hydrogenated dimethyl silyl end group), a copolymer having (dimethyl) (hydromethyl) polysiloxane unit (including trimethyl silyl end group), a copolymer having (dimethyl) (hydromethyl) polysiloxane unit (including hydrogenated dimethyl silyl end group), hydrogenated methyl polysiloxane having trimethyl silyl end group and cyclic hydrogenated methyl polysiloxane.

In some cases, the organopolysiloxane B may be the mixture of dimethyl polysiloxane containing hydrogenated dimethyl silyl end group and organopolysiloxanes containing at least three hydrogenated silyl.

Organopolysiloxane Resin B'

As an alternative, at least one organopolysiloxane resin B' having at least two hydrogen atoms bonded to the same or different Si-atom per molecule may be used, or the organopolysiloxane resin B' having at least one hydrogen atom bonded to the same or different Si-atom per molecule may be used in case of using the mixture.

Said organopolysiloxane resin B' comprises
a) at least two different siloxane units selected from siloxane unit M of formula $R_3SiO_{1/2}$, siloxane unit D of formula $R_2SiO_{2/2}$, siloxane unit T of formula $RSiO_{3/2}$, and siloxane unit Q of formula $SiO_{4/2}$, in which R denotes monovalent hydrocarbon group with 1 to 20 carbon atoms, and
b) provided that at least one of these siloxane units is siloxane unit T or Q and at least one of siloxane units M, D and T contains Si—H group.

Thus, according to one preferable embodiment, the organopolysiloxane resin B' can be selected from the following groups:
organopolysiloxane resin of formula M'Q, which is basically consisted of the following units:
(a) monovalent siloxane unit M' of formula $(R_2)(H)SiO_{1/2}$; and
(b) tetravalent siloxane unit Q of formula $SiO_{4/2}$; and
organopolysiloxane resin of formula MD'Q, which is basically consisted of the following units:
(a) divalent siloxane unit D' of formula $(R)(H)SiO_{2/2}$
(b) monovalent siloxane unit M of formula $R_3SiO_{12}$; and
(c) tetravalent siloxane unit Q of formula $SiO_{4/2}$;
wherein R represents monovalent hydrocarbyl having 1 to 20 carbon atoms, preferably represents monovalent aliphatic or aromatic hydrocarbyl having 1 to 12, more preferably 1 to 8 carbon atoms.

As a further alternative, the mixture of the at least one organopolysiloxane B having at least one hydrogen atom bonded to the same or different Si-atom per molecule and the at least one organopolysiloxane resin B' having at least one hydrogen atom bonded to the same or different Si-atom per molecule may be used as said component B). In this case, the polysiloxane B and the polysiloxane resin B' can be mixed in any proportion in a wide range, and the mixing proportion may be adjusted depending on the desired product properties such as hardness and the ratio of Si—H to alkenyl group.

In practice, the at least one organopolysiloxane A having at least two alkenyl groups bonded to the Si-atom per molecule and the at least one organopolysiloxane B having at least two hydrogen atoms bonded to the same or different Si-atom per molecule are usually used as component A) or B) or as the main ingredient of the component A) or B) respectively. The polymer in which the polysiloxane chains have a small amount of alkenyl and Si—H groups at the same time may be also theoretically feasible, but in this case such a polysiloxane having small amount of alkenyl and Si—H groups is usually categorized as the component B).

At Least One Platinum Group Metal Based Catalyst C)

In the composition according to the present invention, the platinum group metal based curing catalyst C is consisting of at least one known platinum group metal or compound thereof. So-called platinum group metal is also known as the platinum metal, and this term includes in addition to Platinum, Ruthenium, Rhodium, Palladium, Osmium and Iridium. Platinum and Rhodium compounds are preferably used. Platinum complexes and organic compound are described for example in U.S. Pat. Nos. 3,159,601, 3,159,602, 3,220,972, EP A 0 057 459, EP A 0 188 978 and EP A 0190 530, and in particular the complex of platinum with vinyl organosiloxane as described for example in U.S. Pat. Nos. 3,419,593, 3,715,334, 3,377,432 and 3,814,730 can be used.

The amount of the at least one platinum group metal based catalyst according to the present invention is within 0.1-1,000 ppm, preferably 1-400 ppm, and more preferably to 5-100 ppm, calculated by metal and based on the weight of the component A) in the composition.

Usually preferred catalyst is Platinum.

Tackifier Component D)

As the key point of the present invention, the inventors have found that, if the tackifier component contains the specific combination of alkenyl or hydrosilyl group containing isocyanurate compound E and adhesion-imparting ingredient having at least two functional groups selected from alkenyl, epoxy group, alkoxy and hydrosilyl group, which consists of polysiloxane F and optionally coupling agent G, the good adhesion force to the substrate which would be difficult to adhere such as PPA and metals may be surprisingly achieved, in the meantime maintaining the high transmittance and the storage stability. In a preferred embodiment, the tackifier component D) is consisting of said isocyanurate compound E and said adhesion-imparting ingredient.

Furthermore, the inventors have found that the metallic condensation catalysts can be even omitted if the specific combination of said isocyanurate compound and adhesion-impairing ingredient is used in the tackifier component according to the invention. The metallic condensation catalysts in LED enclosure material composition is commonly used to incur the reaction between functional groups such as epoxy and alkoxy of the adhesion-impairing ingredient. Traditionally, for example, zirconium catalysts or aluminum catalysts such as alkoxy aluminum, acylated aluminum and its salt as well as aluminium chelate are typically used as suitable metallic condensation catalysts. However, very harsh process conditions are required during operating to prevent the quality of products from deterioration because these metallic condensation catalysts such as some aluminium chelate catalysts may react when exposed in the air for a few minutes. Therefore, it is obviously beneficial for the LED enclosure material composition to omit the metallic condensation catalysts.

In said adhesion-imparting ingredient, a part of polysiloxane F may be optionally replaced by the coupling agent G, provided that the adhesion-imparting ingredient has at least two functional groups selected from alkenyl, epoxy group, alkoxy and hydrosilyl group. These coupling agents normally contain thus at least one or more of these groups. Considering that the slow hydrolysis of some coupling agents during storage will sometimes render the product turbid, the coupling agents should not exceed the amount of 80%, preferably no more than 60%, for example, no more than 30% in the adhesion-imparting ingredient.

Because the adhesion-imparting ingredient but not polysiloxane itself which makes up the adhesion-imparting ingredients is required to have at least two functional groups selected from alkenyl, epoxy group, alkoxy and hydrosilyl group, in one embodiment it is possible to use the polysiloxane molecule which itself contains at least two functional groups selected from alkenyl, epoxy group, alkoxy and hydrosilyl group, or it is also possible to use the polysiloxane molecule which itself contains only one functional group selected from alkenyl, epoxy group, alkoxy and hydrosilyl group, and use one or more other polysiloxane molecule which contains another different functional group selected from alkenyl, epoxy group, alkoxy and hydrosilyl group or the partly replacing coupling agent which contains at least one different functional group selected from alkenyl, epoxy group, alkoxy and hydrosilyl group.

Isocyanurate tackifier agents are chemically similar to the groups of PPA, but herein it is also required that isocyanurate compounds E must contain alkenyl or hydrosilyl group which can participate in the hydrosilylation addition reaction. On one hand this structural similarity contributes to form a certain degree of affinity of isocyanurate compounds with PPA, and thus it is speculated from the chemical structures that the isocyanurate compounds and PPA may form stronger hydrogen bonds. On the other hand, the tackifier compounds are bonded to the organic silicone because they contain alkylen group Si—H bond which is able to participate in hydrosilylation addition reaction. Thus, the isocyanurate compounds serve as the adhesive bridge between PPA and the organic silicone. In addition, if the isocyanurate tackifier compounds contain no alkenyl or hydrosilyl group, due to the large refractive index difference between this substance and the silicon polymer, a small addition amount leads to no significant adhesion effect in while an excessive addition amount results in turbidity. But the isocyanurate tackifier compounds having alkenyl or hydrosilyl group will achieve good reaction at molecule level upon curing, and thus the adhesion may be increased without obviously affecting the transparency. Moreover, the adhesion-imparting ingredient having at least two functional groups selected from alkenyl, epoxy, alkoxy and hydrosilyl groups can function as an adhesion promoter obviously. Normal coupling agents can also function as the adhesion promoter, but they are intended to be hydrolyzed so that the product becomes turbid during storage and thus the proportion of the coupling agent in the tackifier agent should be controlled if the coupling agent is added.

The alkenyl or hydrosilyl group containing isocyanurate compound can be represented by the following structural formula III

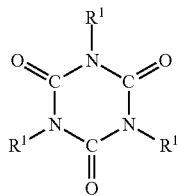

III in which $R^1$ represents, identically or differently, $C_{1-12}$-alkyl, $C_{2-12}$-alkenyl, $C_{6-20}$-aryl, -aralkyl or -alkaryl, wherein the said alkyl, alkenyl, aryl, aralkyl or alkaryl group may be substituted by oxiranyl, alkylalkoxy silane and linear or cyclic polysiloxane groups, provided that at least one group $R^1$ comprises alkenyl or hydrosilyl group, thereby enabling to participate in hydrosilylation addition reaction.

Herein, said "alkyl", including alkyl of said substituent and alkyl of said alkoxy group, can be linear, branched or cyclic alkyl having 1-12, preferably 1-8, more preferably 2-6 carbon atoms, and is thus, for example, methyl, ethyl, propyl, butyl, pentyl, hexyl, heptyl, octyl, nonyl, decyl, hendecyl or dodecyl. Accordingly, the preferable alkoxy groups are methoxy, ethoxy, propoxy, butoxy, pentyloxy and hexyloxy.

Said "alkenyl" can have 2-12, preferably 2-8, more preferably 2-6 carbon atoms. In a preferred embodiment, olefinic bond is located on the end of alkenyl, and thus preferable alkenyl is, for example, vinyl, allyl and vinyl propyl, etc.

Said "aryl, aralkyl or alkylaryl" can have 6-20, preferably 6-12 and more preferably 6-8 carbon atoms, and is thus, for example, phenyl, naphthyl, tolyl, ethylphenyl, propylphenyl, benzyl, phenylethyl and phenylpropyl, preferably phenyl.

Said "alkylalkoxy silane group" is obtained by substituting hydrogen of silane with alkyl and alkoxy groups. Preferably, the alkylalkoxy silane group is trialkoxy silane group. The silane group can be, for example, linear or cyclic silyl, disilanyl, trisilanyl, tetrasilanyl, pentasilanyl or hexasilanyl. Therefore, the preferred alkylalkoxy silane group is, for example, trimethoxy silyl, triethoxy silyl and so on.

Said "polysiloxane group" is, for example, linear or cyclic disiloxane, trisiloxane, tetrasiloxane or cyclotetrasiloxane and so on. Said "polysiloxane group" can also optionally be substituted with alkyl such as methyl or ethyl, for example tetramethyl cyclotetrasiloxane group.

Therefore, in said isocyanurate compounds, preferably $R^1$ independently of each other represents methyl, ethyl, propyl, butyl, vinyl, allyl, glycidyl, 1-trimethoxysilyl propyl, tetramethyl cyclotetrasiloxane groups etc.

The preferred and illustrative examples of isocyanurate compounds are the following:

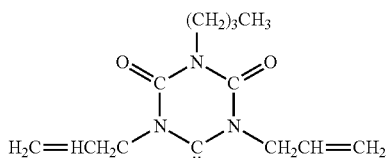

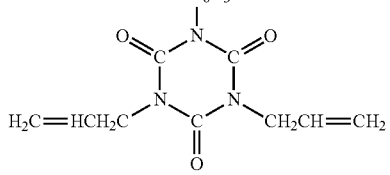

-continued

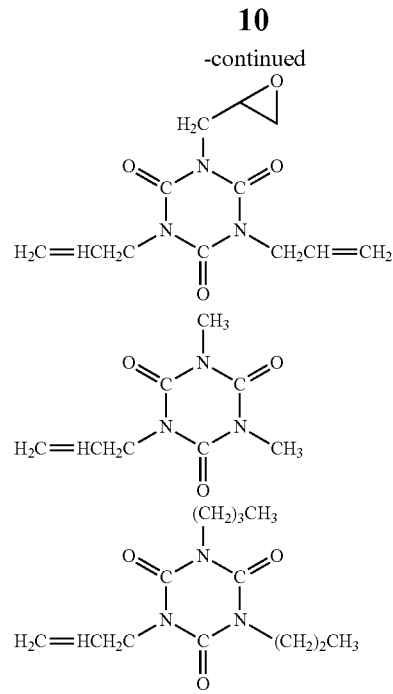

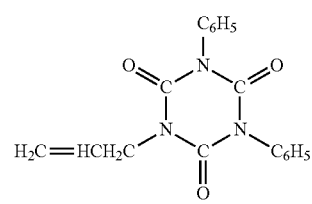

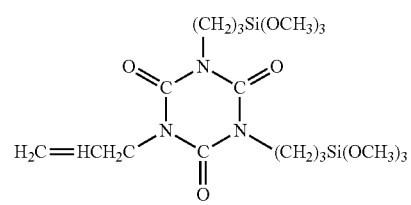

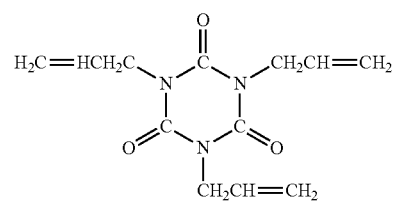

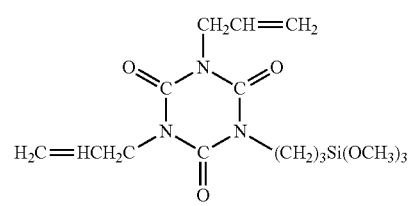

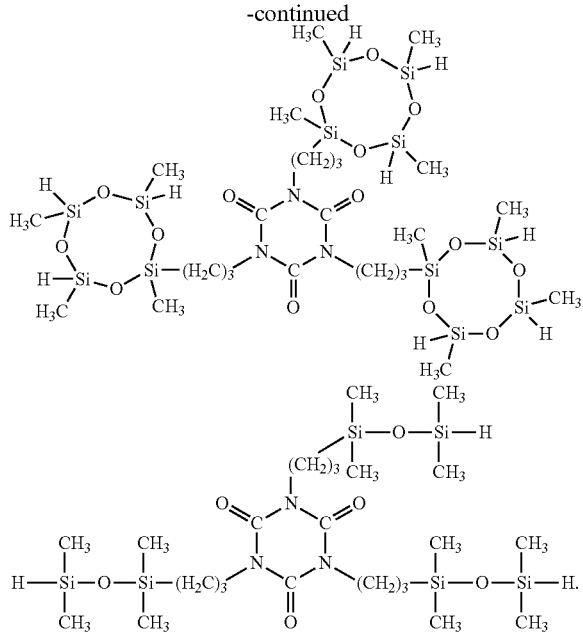

More preferably, said isocyanurate compound is the isocyanurate of formula III wherein one or two of groups $R^1$ represent allyl and the other comprise epoxy or alkoxy moiety, or is triallyl isocyanurate.

In addition, said alkenyl or hydrosilyl group containing isocyanurate compound E as described above are used in the compositions according to the present invention, which widens the range of raw materials for the silicone rubber composition for LED enclosure materials.

In the component D, the polysiloxane F itself having functional groups such as alkenyl, epoxy group, alkoxy and/or hydrosilyl group may be used, which has polysiloxane backbone and alkenyl, epoxy group, alkoxy and/or hydrosilyl groups bonded to the polysiloxane backbone as end group or side chain. The number of Si atoms contained in the polysiloxane backbone is 2-2000, preferably 2-1000, for example 4-600 or 4-100. Beneficially, it can be linear or cyclic organopolysiloxane.

In one embodiment, said polysiloxane F comprises siloxy unit of formula (I.1) and siloxy unit selected from at least one of formulae (I.2), (I.3), (I.4) and (I.5):

 (I.1)

 (I.2)

 (I.3)

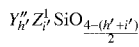 (I.4)

 (I.5)

in which
a'=1 or 2, b'=0, 1 or 2, and a'+b'=1, 2 or 3,
c'=1, 2 or 3,
d'=1 or 2, e'=0, 1 or 2 and d'+e'=1, 2 or 3,
f'=1 or 2, g'=0, 1 or 2 and f'+g'=1, 2 or 3,
h'=1 or 2, i'=0, 1 or 2 and h'+i'=1, 2 or 3,
Y independently of each other denotes hydrocarbyl group with epoxy functionality which optionally comprises one or more hetero atoms such as oxygen atom and preferably contains 2 to 20 carbon atoms, more preferably selected from alkyl glycidyl ether, linear, branched and/or cyclic epoxy alkyl, linear, branched and/or cyclic alkenyl and glycidyl esters of carboxylic acids,
Y' independently of each other denotes alkoxy group, preferably alkoxy group having 1 to 12, more preferably 1 to 6 carbon atoms, most preferably methoxy or ethoxy group,
Y" independently of each other denotes $C_{2-12}$ alkenyl, preferably $C_{2-6}$ alkenyl, most preferably vinyl or allyl,
$Z^1$, $Z^2$, $Z^3$, identically or differently, denotes monovalent hydrocarbyl group having 1 to 30, preferably 1 to 12 carbon atoms, which optionally contains one or more heteroatoms and is preferably selected from $C_{1-8}$ alkyl group, including alkyl optionally substituted by at least one halogen atom, and also preferably selected from aryl group, in particular $C_{6-20}$ aryl group.

In a preferred embodiment, said $Z^1$, $Z^2$, $Z^3$ can be selected from methyl, ethyl, propyl, 3, 3, 3-trifluoropropyl group, phenyl, xylyl and tolyl and the like.

In another preferred embodiment, said polysiloxane F comprises at least one siloxy unit of formula (I.2) having at least one epoxy hydrocarbyl and at least three siloxy unit of formula (I.5) having hydrosiloxy groups per molecule.

In a further preferred embodiment, said polysiloxane F comprises at least one, preferably two to five siloxy unit of formula (I.2) having epoxy hydrocarbyl per molecule.

According to the present invention, the content of the siloxy unit of formula (I.5) can be, for example, less than or equal to 1.6 mol per 100 g of the polysiloxane F, preferably from 0.1 to 1.5 mol per 100 g of the polysiloxane F.

According to another preferred embodiment, the number N2 of siloxy unit of formula (I.2) having epoxy functional hydrocarbyl group and the number N5 of siloxy units of formula (I.5) satisfy the following conditions:
1≤N2≤10 and preferably 1≤N2≤5, and
3≤N5≤20 and preferably 5≤N2≤20.

Some examples of favorable polysiloxane F are described in such as WO2011/117230, which is incorporated herein by reference. Herein, some preferred examples of the polysiloxane F are illustrated:

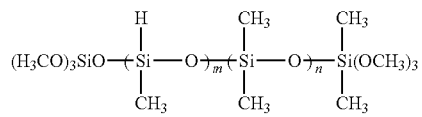

(m: 0-200, n: 0-1000, preferably m: 1-50, n: 1-100)

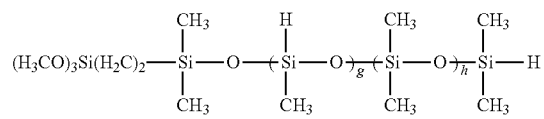

(g: 0-200, h: 0-1000, preferably g: 1-20, h: 1-100)

-continued

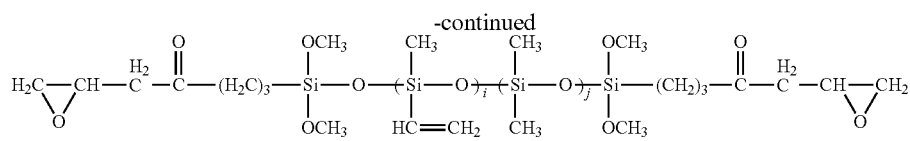

(i: 0-200, j: 0-1000, preferably i: 1-50, j: 1-100)

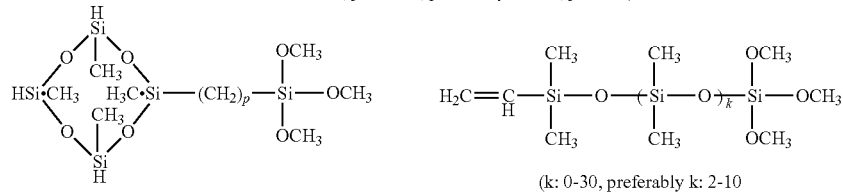 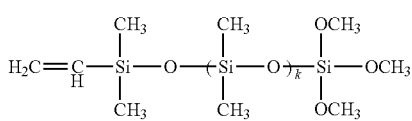

(p: 1-30, preferably p: 1-10)   (k: 0-30, preferably k: 2-10

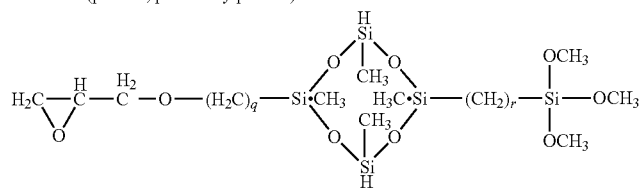

(q: 0-30, r: 1-30, preferably q: 0-10, r: 1-10)

Furthermore, as an alternative, a part of the above-described polysiloxane can be replaced by some coupling agents, these coupling agents comprise preferably alkenyl group so that they can participate in the hydrosilylation addition reaction. As mentioned above, it should be noticed that the amount of the coupling agents do not exceed 80% by weight, preferably no more than 60% by weight, for example, no more than 30% by weight in the adhesion-imparting ingredient. In principle, these coupling agents for replacement per se and the methods for producing the same are known for one skilled in the art, and therefore there are no peculiar restrictions as long as the optical properties of the coupling agent such as refractive index and transparency can match with the other components of the composition and the transparency will not be obviously affected by slow hydrolysis during storage. Examples of these coupling agents are as follows:

alkoxyorganosilane containing at least one $C_{1-6}$ alkenyl per molecule such as vinyl trimethoxy silane and vinyl triethoxy silane, organic silicon compounds containing at least one epoxy group, preferably selected from (3,4-epoxycyclohexyl) ethyl triethoxysilane [Coatosil® 1770], and (γ-glycidoxypropyl)trimethoxy silane [Dynasilan® GLYMO] and (γ-methacryloxypropyl)trimethoxy silane [Dynasilan® MEMO], more preferably (γ-glycidoxypropyl) trimethoxy silane [Dynasilan® GLYMO], another example has the following structure:

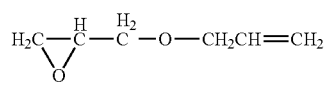

In the curable silicone rubber composition according to the present invention, the amount of the tackifier component can be advantageously in the range of 0.005-30%, preferably 0.005-15%, and more preferably 0.1-10%, especially preferably 0.5-5% based on the total weight of all components of the composition. Furthermore, assuming the total weight of the tackifier component is 1 part by weight, the isocyanurate compound accounts for 0.01-0.9 part by weight, preferably 0.1 to 0.8 part by weight, and more preferably 0.1-0.6 part by weight.

Other Additives

In the composition of the present invention, in addition to the aforementioned components (A) to (D), some of known additives may be added as required. Preferably these additives are added in the amount of no more than 60%, such as from 0 to 50%, preferably from 0 to 30%, more preferably from 0 to 10%, based on the total weight of the compositions of the present invention.

For example, without impairing the purpose and effect of the present invention, aging inhibitors, free radical inhibitors, UV absorbers, adhesion modifiers, flame retardant additives, surfactants, storage stability improver, ozone degradation inhibitors, light stabilizers, viscosity builders, plasticizers, antioxidants, thermal stabilizers, conductivity imparting agents, antistatic agents, radiation shielding agents, nucleating agents, phosphorus containing peroxide decomposers, lubricants, pigments, metal ion deactivators, physical properties controlling agent, filler, curing inhibitor, and other additives may be added into the composition of the present invention.

In particular, the composition according to the present invention may include some fillers, e.g., reinforcing inorganic filler such as fumed silica and fumed titania, as well as non-reinforcing inorganic fillers such as calcium carbonate, calcium silicate, titanium dioxide and zinc oxide.

Without affecting storage stability of the product, the compositions may also comprise small amounts of other conventional coupling agents in addition to the coupling agent mentioned in the component D) described above. No peculiar limitation is imposed on the types of the coupling agents.

Production and Curing of the Silicone Rubber Composition

The silicone rubber composition according to the present invention can be produced by proportionally uniformly mixing the above-mentioned components (A) to (D) and optionally other additives. Generally, in order to avoid curing of the reactive components during storage, the reactive components are separately stored in two or more containers to separate from each other, and they are mixed and cured just before use. Certainly, the respective components may be mixed and formulated into the liquid mixture by adding small amounts of alkynol curing inhibitors or alkenyl curing agents. Herein, suitable inhibitors may be selected from, for example, the following preferable group:

1-ethynyl-1-cyclopentanol, 1-ethynyl-1-cyclohexanol, 1-ethynyl-1-cycloheptanol, 1-ethynyl-1-cyclooctanol, 3-methyl-1-butyne-3-ol, 3-methyl-1-pentyne-3-ol, 3-methyl-1-hexyne-3-ol, 3-methyl-1-heptyne-3-ol, 3-methyl-1-octyne-3-ol, 3-methyl-1-nonyl-3-ol, 3-methyl-1-decyne-3-ol, 3-methyl-1-dodecyne-3-ol, 3-ethyl-1-pentyne-3-ol, 3-ethyl-1-hexyne-3-ol, 3-ethyl-1-heptyne-3-ol, 3-butyne-2-ol, 1-pentyne-3-ol, 1-hexyne-3-ol, 1-heptyne-3-ol, 5-methyl-1-hexyne-3-ol, 3,5-dimethyl-1-hexyne-3-ol, 3-isobutyl-5-methyl-1-hexyne-3-ol, 3,4,4-trimethyl-1-pentyne-3-ol, 3-ethyl-5-methyl-1-heptyne-3-ol, 4-ethyl-1-octyne-3-ol, 3,7,11-trimethyl-1-dodecyne-3-ol, 1,1-diphenyl-2-propyne-1-ol and 9-ethynyl-9-fluorenol. Most preferred is 3,7,11-trimethyl-1-dodecyne-3-ol (TMDDO).

The silicone rubber composition according to the present invention can be usually cured at the temperature of 40-250° C., preferably 60-200° C. The curing lasts for 5 min-10 hours, preferably 30 minutes-6 hours.

The curable silicone rubber composition according to the present invention can provide good adhesion force to the substrate which would be difficult to adhere such as PPA, metal etc, and the organic silicone composition has high transmittance after curing and can keep the long-term stability during the storage. Therefore, it is very suitable for LED enclosure products.

BRIEF DESCRIPTION OF THE DRAWING

FIG. 1 shows the structure of the substrate for measuring shear strength.

The following examples illustrate the invention in more detail, but the present invention is not limited to the following examples. In addition, percentages and proportions in the present specification are calculated by weight, unless explicitly stated otherwise.

Example 1

3.2 parts by weight of methyl vinyl cyclosiloxane (CAS: 68082-23-5) and 9 ppm platinum complex catalyst are added into the mixture of 56.5 parts by weight of Resine 10341 (from Bluestar Silicones, the mixture of vinyl both terminated polysiloxane having the viscosity of about 60000 mpa·s and vinyl silicone resin $MD^{Vi}Q$) and 43.5 parts by weight of Vinyl Polymer N°1 (from Bluestar Silicones, the mixture of vinyl both terminated polysiloxane having the viscosity of about 3500 mpa·s and vinyl silicone resin $MD^{Vi}Q$). Subsequently, hydrogen-containing organopolysiloxane resin $Si(O(CH_3)_2SiH)_4$ (CAS: 68988-57-8) is added in such an amount that the molar amount of SiH group in the formulation is 1.6 times the molar amount of vinyl group. Tackifier component comprises 0.59 parts of vinyltrimethoxysilane, 0.98 parts of ADD 382, 0.59 parts of ADD 380 and 0.59 parts of TAIC. Thus the silicone rubber composition is obtained.

Structures of the related substances are shown below:

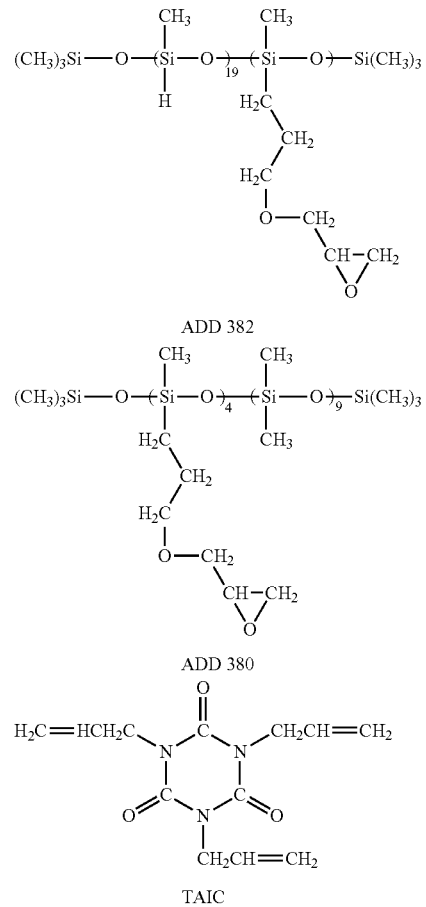

ADD 382

ADD 380

TAIC

Example 2

The silicone rubber composition is obtained in accordance with the same method and the formulation as Example 1, except that the tackifier component comprises 0.59 parts by weight of vinyltrimethoxysilane, 1.59 parts by weight of ADD 382 and 0.59 parts by weight of TAIC.

Example 3

The silicone rubber composition is obtained in accordance with the same method and the formulation as Example 1, except that the tackifier component comprises 0.98 parts by weight of ADD 382, 0.59 parts by weight of ADD 380 and 0.59 parts by weight of TAIC.

Example 4

The silicone rubber composition is obtained in accordance with the same method and the formulation as Example 1, except that the tackifier component comprises 0.59 parts by weight of vinyltrimethoxysilane, 0.98 parts by weight of ADD 382, 0.59 parts by weight of GLYMO and 0.59 parts by weight of TAIC.

Comparative Example 1

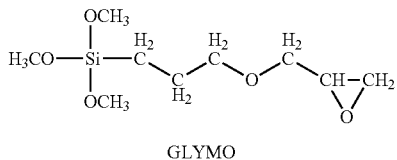 [SMILES: CO[Si](CCCOCC1CO1)(OC)OC]

GLYMO

The silicone rubber composition is obtained in accordance with the same method and the formulation as Example 1, except that the tackifier component comprises 0.59 parts by weight of vinyltrimethoxysilane, 0.98 parts by weight of ADD 382 and 0.59 parts by weight of ADD 380.

Comparative Example 2

The silicone rubber composition is obtained in accordance with the same method and the formulation as Example 1, except that the tackifier component comprises 0.59 parts by weight of vinyltrimethoxysilane and 1.59 parts by weight of ADD 382.

Comparative Example 3

The silicone rubber composition is obtained in accordance with the same method and the formulation as Example 1, except that the tackifier component comprises 0.59 parts by weight of vinyltrimethoxysilane, 0.59 parts by weight of ADD 382, 33 parts by weight of ADD 380 and 0.59 parts by weight of TAIC.

Comparative Example 4

The silicone rubber composition is obtained in accordance with the same method and the formulation as Example 1, except that the tackifier component comprises 0.59 parts by weight of vinyltrimethoxysilane, 0.59 parts by weight of ADD 380 and 0.59 parts by weight of the following structures containing isocyanurate group.

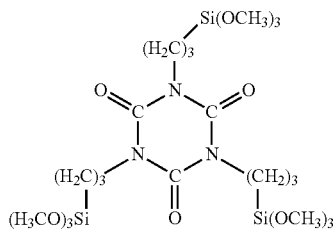

Comparative Example 5

The silicone rubber composition is obtained in accordance with the same method and the formulation as Example 1, except that the tackifier component comprises 0.59 parts by weight of vinyltrimethoxysilane, 0.98 parts by weight of ADD 382, 0.59 parts by weight of ADD 380 and 0.12 parts by weight of aluminum metal chelate catalyst. Said aluminum metal chelate catalyst has the following structure:

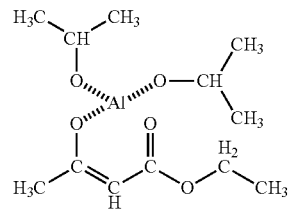

Comparative Example 6

The silicone rubber composition is obtained in accordance with the same method and the formulation as Example 1, except that the tackifier component comprises 0.59 parts by weight of vinyltrimethoxysilane, 0.98 parts by weight of ADD 382, 0.59 parts by weight of ADD 380 and 0.59 parts by weight of aluminum metal chelate catalyst. Said aluminum metal chelate catalyst has the same structure as that of Comparative Example 5.

Performance Evaluation

In the following methods, all compositions produced are evaluated, and the results are shown in table 1.

Appearance: the composition is heated and cured for 3 hours at 150° C. to form the cured product with a thickness of 1 mm. The appearance is observed by visual observation.

Transmittance: the transmittance is determined using a UV spectrophotometer (450 nm).

Hardness: the hardness is determined according to ASTM D2240.

Tensile strength and elongation at break: they are determined according to ASTM D412.

Shear Strength:

As shown in FIG. 1, the substrate sheets 1 and 2 with a width of 25 mm are fabricated from PPA. One end of substrate sheet 1 and one end of substrate sheet 2 are overlapped and the composition layer 3 having the thickness of 0.2 mm is clamped. The overlapped part has a length of 12.5 mm. They are then heated at 150° C. for 3 hours to cure the composition layer 3. The test samples produced are placed at room temperature for more than 12 hours, then the non-overlapped ends 4 and 5 of the test samples are stretched along the direction of the arrow by using cupping machine and the shear strength are determined.

Cohesion Destruction Rate:

The cohesion destruction rate is determined by evaluating the fracture surfaces of substrate sheet subjected to shear force, that is, the cohesion destruction rate is the percentage ratio of the area of the region without interfacial delamination to the total area of fracture surfaces.

TABLE 1

|  | Example 1 | Example 2 | Example 3 | Example 4 |
|---|---|---|---|---|
| SiH/SiVi (molar ratio) | 1.6 | 1.6 | 1.6 | 1.6 |
| Appearance | colorless and transparent | colorless and transparent | colorless and transparent | colorless and transparent |
| Refractive index | 1.41 | 1.41 | 1.41 | 1.41 |
| Curing conditions | 150° C./3 h | 150° C./3 h | 150° C./3 h | 150° C./3 h |
| Hardness | 71 | 70 | 67 | 70 |
| Tensile strength (Mpa) | 10 | 9 | 8.1 | 9.3 |

TABLE 1-continued

| | Example 1 | Example 2 | Example 3 | Example 4 |
|---|---|---|---|---|
| Elongation at break (%) | 60 | 60 | 70 | 60 |
| Transmittance (%) | 93 | 92 | 92 | 91 |
| Shear strength (Mpa) | 5.5 | 5.4 | 5.0 | 5.5 |
| Cohesion destruction rate (%) | 90 | 85 | 80 | 90 |

TABLE 2

| | Comparative Example 1 | Comparative Example 2 | Comparative Example 3 | Comparative Example 4 | Comparative Example 5 | Comparative Example 6 |
|---|---|---|---|---|---|---|
| SiH/SiVi (Molar ratio) | 1.6 | 1.6 | 1.6 | 1.6 | 1.6 | 1.6 |
| Appearance | colorless and transparent | colorless and transparent | white | turbid and slight white | colorless and transparent | colorless and transparent |
| Refractive index | 1.41 | 1.41 | 1.41 | 1.41 | 1.41 | 1.41 |
| Curing conditions | 150° C./ 3 h | 150° C./ 3 h | 150° C./ 3 h | 150° C./ 3 h | 150° C./ 3 h | 150° C./ 3 h |
| Hardness | 72 | 70 | 58 | 60 | 68 | 70 |
| Tensile strength (Mpa) | 11 | 12 | 5.8 | 7 | 9 | 9.5 |
| Elongation at break (%) | 60 | 70 | 60 | 100 | 70 | 70 |
| Transmittance (%) | 93 | 94 | 17 | 75 | 88 | 84 |
| Shear strength (Mpa) | 5.1 | 5.6 | 0.4 | 4.8 | 4.3 | 4.7 |
| Cohesion destruction rate (%) | 10 | 20 | 0 | 40 | 50 | 80 |

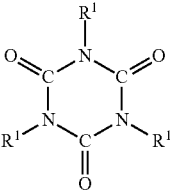

III in which $R^1$ represents, identically or differently, $C_{1-12}$-alkyl, $C_{2-12}$-alkenyl, $C_{6-20}$-aryl, -aralkyl or -alkaryl,

What is claimed is:

1. A curable silicone rubber composition comprising:

(A) at least one organopolysiloxane A having at least two alkenyl groups bonded to the Si-atom per molecule, or a combination of the at least one organopolysiloxane A with at least one organopolysiloxane resin A', (B) at least one organosiloxane B or organosiloxane resin B' having at least two hydrogen atoms bonded to the same or different Si-atom per molecule, or a mixture of organosiloxane B and organosiloxane resin B' having at least one hydrogen atom bonded to the same or different Si-atom per molecule, (C) at least one platinum group metal based catalyst C, and (D) at least one tackifier component D, which comprises
   a) an isocyanurate compound E comprising an alkenyl or a hydrosilyl group, and
   b) an adhesion-imparting ingredient which comprises:
      a polysiloxane F having at least two distinct functional groups selected from the group consisting of alkenyl, epoxy, alkoxy and hydrosilyl groups, and
      optionally a coupling agent G, and wherein the isocyanurate compound E comprising an alkenyl or a hydrosilyl group in component D) is of the following formula III:

wherein said alkyl, alkenyl, aryl, aralkyl or alkaryl groups are optionally substituted with oxiranyl, and linear or cyclic polysiloxane groups, provided that at least one group $R^1$ comprises an alkenyl or hydrosilyl group.

2. The composition according to claim 1, wherein $R^1$ independently from each other represents methyl, ethyl, propyl, butyl, vinyl, allyl, glycidyl, or tetramethyl cyclotetrasiloxane groups.

3. The composition according to claim 1, wherein the isocyanurate compound E is the isocyanurate of formula III wherein one or two of groups $R^1$ represent allyl and the other comprises an epoxy moiety, or the isocyanurate compound E is triallyl isocyanurate.

4. The composition according to claim 1, wherein the organopolysiloxane resin A' comprises:
   a) at least two different siloxane units selected from the group consisting of siloxane unit M of formula $R_3SiO_{1/2}$, siloxane unit D of formula $R_2SiO_{2/2}$, siloxane unit T of formula $RSiO_{3/2}$ and siloxane unit Q of formula $SiO_{4/2}$, in which R denotes a monovalent hydrocarbyl group having 1 to 20 C atoms,
   b) provided that at least one of these siloxane units is siloxane unit T or Q and at least one of siloxane units M, D and T comprises an alkenyl group.

5. The composition according to claim 1, wherein the organopolysiloxane resin B' comprises:

a) at least two different siloxane units selected from the group consisting of siloxane unit M of formula $R_3SiO_{1/2}$, siloxane unit D of formula $R_2SiO_{2/2}$, siloxane unit T of formula $RSiO_{3/2}$ and siloxane unit Q of formula $SiO_{4/2}$, in which R denotes a monovalent hydrocarbyl group having 1 to 20 C atoms,
b) provided that at least one of these siloxane units is siloxane unit T or Q and at least one of siloxane units M, D and T comprises a Si—H group.

6. The composition according to claim 1, wherein the molar ratio of Si—H group to alkenyl group in the composition is in a range of from 0.7 to 4.

7. The composition according to claim 1, wherein component D is present in an amount ranging from 0.005% to 30%, relative to the total weight of individual components of the composition.

8. The composition according to claim 7, wherein the component D is present in an amount ranging from 0.005 to 15% relative to the total weight of individual components of the composition.

9. The composition according to claim 1, wherein the composition comprises no metallic condensation catalysts.

10. The composition according to claim 9, wherein the metallic condensation catalysts include aluminium chelating compound catalysts.

11. The composition according to claim 1, wherein polysiloxane F of the tackifier component D comprises a siloxy unit of formula (I.1) and siloxy unit selected from at least one of formulae (I.2), (I.3), (I.4) and (I.5):

  (I.1)

  (I.2)

  (I.3)

  (I.4)

  (I.5)

in which
a'=1 or 2, b'=0, 1 or 2, and a'+b'=1, 2 or 3,
c'=1, 2 or 3,
d'=1 or 2, e'=0, 1 or 2 and d'+e'=1, 2 or 3,
f'=1 or 2, g'=0, 1 or 2 and f'+g'=1, 2 or 3,
h'=1 or 2, i'=0, 1 or 2 and h'+i'=1, 2 or 3,
Y independently of each other represents a hydrocarbyl group with an epoxy functionality which optionally comprises one or more heteroatoms,
Y' independently of each other represents an alkoxy group,
Y" independently of each other represents a $C_{2-12}$ alkenyl,
$Z^1$, $Z^2$, $Z^3$, identically or differently, represent a monovalent hydrocarbyl group having 1 to 30, which optionally comprises one or more heteroatoms.

12. The composition according to claim 11, wherein when Y comprises a heteroatom, the heteroatom is oxygen.

13. The composition according to claim 11, wherein Y has 2 to 20 carbon atoms.

14. The composition according to claim 11, wherein Y is selected from the group consisting of alkyl glycidyl ether, linear, branched and/or cyclic epoxy alkyl, linear, branched and/or cyclic epoxy alkenyl and glycidyl esters of carboxylic acids.

15. The composition according to claim 11, wherein Y' is an alkoxy having 1 to 12 carbon atoms.

16. The composition according to claim 11, wherein Y' has 1 to 6 carbon atoms.

17. The composition according to claim 11, wherein Y' is a methoxy or ethoxy group.

18. The composition according to claim 11, wherein Y" is a $C_{2-6}$ alkenyl.

19. The composition according to claim 11, wherein Y" is a vinyl or allyl.

20. The composition according to claim 11, wherein $Z^1$, $Z^2$, and $Z^3$ have 1 to 12 carbon atoms.

21. The composition according to claim 11, wherein $Z^1$, $Z^2$, and $Z^3$ represent a $C_{1-8}$ alkyl group.

22. The composition according to claim 11, wherein $Z^1$, $Z^2$, and $Z^3$ represent an alkyl optionally substituted by at least one halogen atom.

23. The composition according to claim 11, wherein $Z^1$, $Z^2$, and $Z^3$ are an aryl group.

24. The composition according to claim 23, wherein the aryl group is a $C_{6-20}$ aryl group.

25. The composition according to claim 1, wherein the tackifier component D comprises the isocyanurate compound E and the adhesion-imparting ingredient.

26. The composition according to claim 1, wherein when the composition comprises the coupling agent G, the amount of the coupling agent does not exceed 80% by weight, in the adhesion-imparting ingredient.

27. The composition according to claim 26, wherein the amount of the coupling agent does not exceed 60% by weight in the adhesion-imparting ingredient.

28. The composition according to claim 27, wherein the amount of the coupling agent does not exceed 30% by weight in the adhesion-imparting ingredient.

29. A process of preparing the composition according to claim 1, that the process comprising mixing together the individual components A to D and optional other additives.

30. A silicone rubber, obtained by curing the composition according to claim 1.

31. An LED enclosure material, the enclosure material comprising the composition according to claim 1.

32. A method of improving adhesion of a curable silicone rubber composition, the method comprising preparing the silicone rubber composition with the tackifier component D according to claim 1, wherein the silicone rubber composition is prepared for effective use in an LED enclosure without using a metallic condensation catalyst.

* * * * *